(12) United States Patent
Okada et al.

(10) Patent No.: US 6,590,286 B2
(45) Date of Patent: Jul. 8, 2003

(54) LAND GRID ARRAY SEMICONDUCTOR DEVICE

(75) Inventors: Makio Okada, Hyogo (JP); Yasushi Kasatani, Hyogo (JP); Tomoaki Hashimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,127

(22) Filed: Oct. 23, 2001

(65) Prior Publication Data

US 2002/0153608 A1 Oct. 24, 2002

(30) Foreign Application Priority Data

Apr. 19, 2001 (JP) .......................................... 2001-120717

(51) Int. Cl.[7] .......................... H01L 23/48; H01L 23/52; H01L 29/40
(52) U.S. Cl. .......................... 257/737; 257/738; 257/780; 257/783
(58) Field of Search ................................. 257/737, 738, 257/780, 783

(56) References Cited

U.S. PATENT DOCUMENTS 6,175,157 B1 * 1/2001 Morifuji ...................... 257/777
6,313,533 B1 * 11/2001 Funaya et al. ............... 257/737
6,420,664 B1 * 7/2002 Muramatsu et al. .......... 174/262

* cited by examiner

*Primary Examiner*—Amir Zarabian
*Assistant Examiner*—Kiesha Rose
(74) *Attorney, Agent, or Firm*—Leydig, Voit & Mayer, Ltd.

(57) ABSTRACT

A land grid array semiconductor device provides greater positioning accuracy for an external electrode with respect to a mounting substrate. External electrodes are arranged on one surface of a substrate in area array. The external electrode includes an external electrode pad and an external electrode interconnection. Each external electrode pad includes a first pad layer having a cylindrical shape and a second pad layer covering the surface of the first pad layer and having a conical shape.

13 Claims, 7 Drawing Sheets

LAND GRID ARRAY SEMICONDUCTOR DEVICE

BACKGROUND OF THE INVENTION

1. Field of the Invention

The present invention generally relates to land grid array (LGA) semiconductor devices and, more specifically to an LGA semiconductor device which has been improved to provide greater positioning accuracy in mounting an electrode portion on a mounting substrate and greater bonding reliability with respect to the mounting substrate after the mounting. Further, the present invention relates to a method of mounting such an LGA semiconductor device.

2. Description of the Background Art

FIG. 9 is a cross sectional view of a conventional LGA type semiconductor device, and FIG. 10 is a bottom view thereof.

Referring to FIGS. 9 and 10, a semiconductor device 7 includes a substrate 2. An external electrode 3 is provided on one surface of substrate 2, and a sealing portion 1 for sealing a semiconductor element or the like is provided on the other surface of substrate 2 which is formed of a material such as a glass epoxy resin. An electrode interconnection made of copper or the like, is provided on the surface of and inside substrate 2, forming an electrical and physical connection with the semiconductor element. As can be seen, external electrode 3 is exposed on the other surface of substrate 2 that is opposite sealing portion 1. External electrode 3 is made of copper or the like which forms an electrical and physical connection with the mounting substrate.

External electrode 3 includes an external electrode pad 4 which is cylindrical in shape and having a smooth surface, and an external electrode interconnection 6 extending from the inside to the outside of substrate 2 via a through hole 5. External electrodes 3 are arranged on a grid, i.e., in area array on the side of substrate 2 that is opposite sealing portion 1.

Since external electrodes 3 are arranged on a grid in a plane, the structure has an advantage in manufacturing in that the greater number of electrodes can be provided per unit part area despite small pitches between electrodes.

Now, the operation of the conventional LGA type semiconductor device will be described.

Referring to FIG. 11, an operation of mounting semiconductor device 7 onto mounting substrate 8 will be described below. Mounting substrate 8 is formed of a material such as a glass epoxy resin. Although not shown, an electrode interconnection made of copper or the like is formed on the surface of mounting substrate 8, which forms an electrical and physical connection with respect to semiconductor device 7. Substrate external electrode 9 is exposed from the surface of mounting substrate 8 and made of copper or the like that forms an electrical and physical connection with respect to semiconductor substrate 7. Substrate external electrodes 9 are provided on the surface of mounting substrate 8 and arranged in area array being opposite to external electrodes 3 of semiconductor device. A bonding medium 10 of a solder paste or the like is printed and applied onto substrate external electrode 9 by means of printing, dispensing or the like.

The mounting operation of conventional semiconductor device 7 is as follows. Namely, bonding medium 10 is preliminarily printed and applied onto substrate external electrode 9 of mounting substrate 8. In this state, semiconductor device 7 is mounted onto mounting substrate 8. Next, external electrode pad 4 of semiconductor device 7 is pressed against bonding medium 10 for bonding. Further, mounting substrate 8 mounted with semiconductor device 7 is made to reflow at a temperature of at least the melting point of bonding medium 10. Thus, bonding medium 10 melts to electrically and physically connect semiconductor device 7 and mounting substrate 8.

Having the above described structure, the conventional semiconductor device suffers from the following problem. Referring to FIG. 11, in mounting semiconductor device 7 onto mounting substrate 8, external electrode pad 4 and bonding medium 10 fail to bond firmly due to a variation in supply amount of bonding medium 10, a variation in mounting height caused by deflection of semiconductor device 7, and so on. As a result, after reflowing, all or some of external electrode pads 4 fail to bond substrate external electrode 9.

SUMMARY OF THE INVENTION

The present invention is made to solve the aforementioned problem. An object of the present invention is to provide a land grid array (LGA) type semiconductor device which has been improved to provide greater positioning accuracy for a mounting substrate and semiconductor device in mounting a substrate.

Another object of the present invention is to provide an LGA type semiconductor device which has been improved to provide greater bonding reliability for a mounting substrate and the mounted semiconductor device.

Another object of the present invention is to provide a method of mounting such an LGA type semiconductor device.

An LGA type semiconductor device according to one aspect of the present invention has external electrodes arranged in area array. The external electrode includes an external electrode pad and an external electrode interconnection extending from the inside to the outside of the substrate via a through hole. The external electrode pad includes a first pad layer formed in a cylinder or rectangular column shape, and a second pad layer provided to cover the surface of the first pad layer and formed in a cone or pyramid shape.

According to one preferred embodiment of the present invention, the second pad layer has a recess in its surface.

According to a more preferred embodiment of the present invention, the recess is a groove formed in a cone or pyramid shape.

According to a more preferred embodiment of the present invention, the substrate further has on its one surface a dummy electrode having a shape different from the above mentioned external electrode pad and not electrically nor physically connected to the external electrode pad.

According to a more preferred embodiment of the present invention, the dummy electrode includes a first layer formed in a cylinder or rectangular column shape, and a second layer provided to cover the surface of the first layer and formed in a cone or pyramid shape.

In a method of mounting an LGA type semiconductor device according to a second aspect of the present invention, first of all, an LGA type semiconductor device is prepared including a substrate which has on its one surface external electrodes arranged in area array. The external electrode includes an external electrode pad and an external electrode interconnection extending from the inside to the outside of the substrate via a through hole. The external electrode pad includes a first pad layer formed in a cylinder or rectangular column shape, and a second pad layer provided to cover the surface of the first pad layer and formed in a cone or pyramid shape. A mounting substrate is prepared having a substrate external electrode and a bonding medium provided to cover the surface of the substrate external electrode. The second pad layer of the LGA type semiconductor device is pressed against the bonding medium of the mounting substrate to bond the LGA type semiconductor device to the mounting substrate. The mounting substrate mounted with the LGA type semiconductor device is annealed at a temperature of at least the melting point of the bonding medium.

According to a preferred embodiment of the present invention, the second pad layer has in its surface a recess.

According to a more preferred embodiment of the present invention, the recess is a groove formed in a cone or pyramid shape.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, the embodiments of the present invention will be described with reference to the drawings.

First Embodiment

Figure 1:
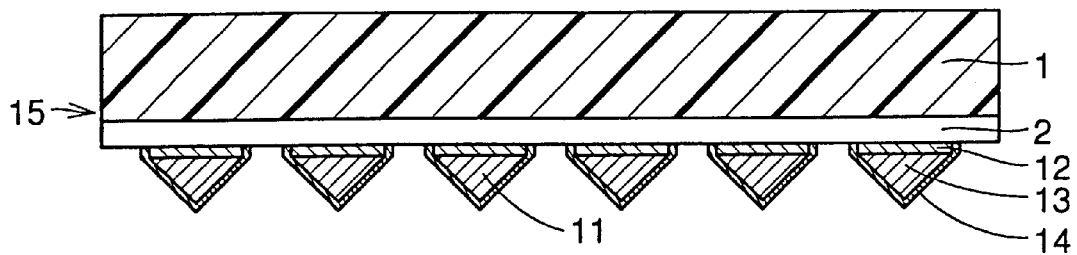
FIG. 1 is a cross sectional view showing an LGA type semiconductor device according to a first embodiment of the present invention.
Figure 2:
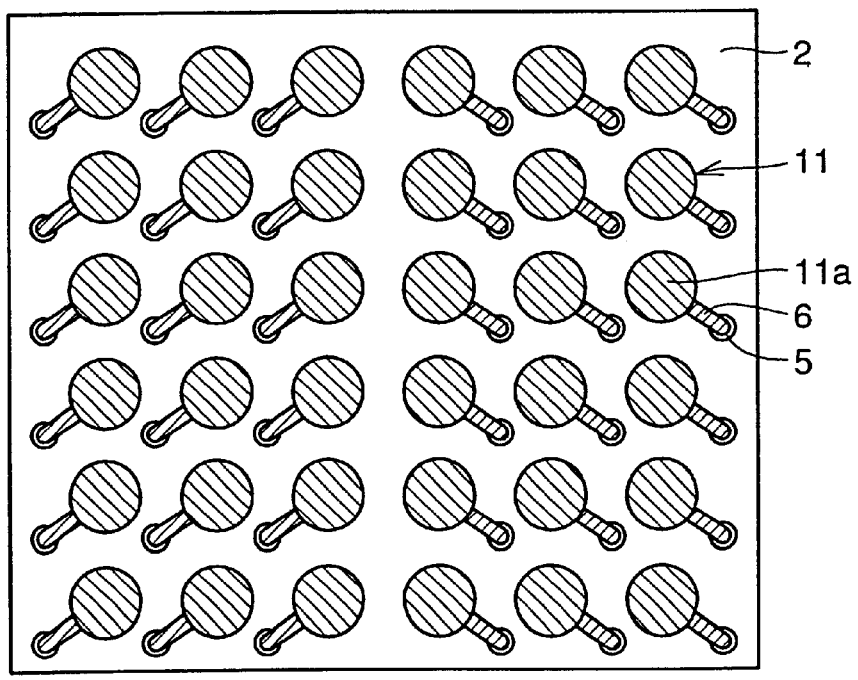
FIG. 2 is a bottom view of the LGA type semiconductor device according to the first embodiment.

FIG. 1 is a cross sectional view showing an LGA type semiconductor device according to the embodiment. FIG. 2 is a bottom view thereof when viewed from below. Note that the same portions as the above described prior art example are denoted by the same reference numerals, and the description thereof will not be repeated.

Referring to FIGS. 1 and 2, a semiconductor device 15 is provided with a substrate 2. An external electrode 11 is exposed on the surface of substrate 2 that is opposite a sealing portion 1. External electrode 11 is used for providing an electrical and physical connection with the mounting substrate. External electrode 11 includes an external electrode pad 11a, and an external electrode interconnection 6 extending from the inside to the outside of substrate 2 via a through hole 5. External electrode pad 11a includes a first pad layer 12 in a cylinder shape, and a second pad layer 13 provided to cover the surface of first pad layer 12 and formed in a pyramid shape. First pad layer 12 is formed of a copper foil or a copper foil applied with a copper solder, having a thickness of 12–32 μm. Second pad layer 13 is formed of copper solder layers, having a height of 12–62 μm.

An antirust medium 14 is formed on the surface of second pad layer 13 for preventing the surface of second pad layer 13 from being oxidized. Antirust medium 14 also serves to promote bonding by the bonding medium in mounting the substrate. Antirust medium 14 is formed of a flux with a gold solder or nickel and gold solders.

External electrodes 11 are arranged in area array on the side of substrate that is opposite sealing portion 1. The arrangement method is not particularly limited. Although first pad layer 12 is illustrated as being cylindrical in shape in the above described embodiment, it may be in a rectangular column shape. Similarly, although second pad layer 13 is illustrated as being a cone, it may be a pyramid. Moreover, the side number of the rectangular column or pyramid is not particularly limited.

Now, the operation will be described.

Figure 3:
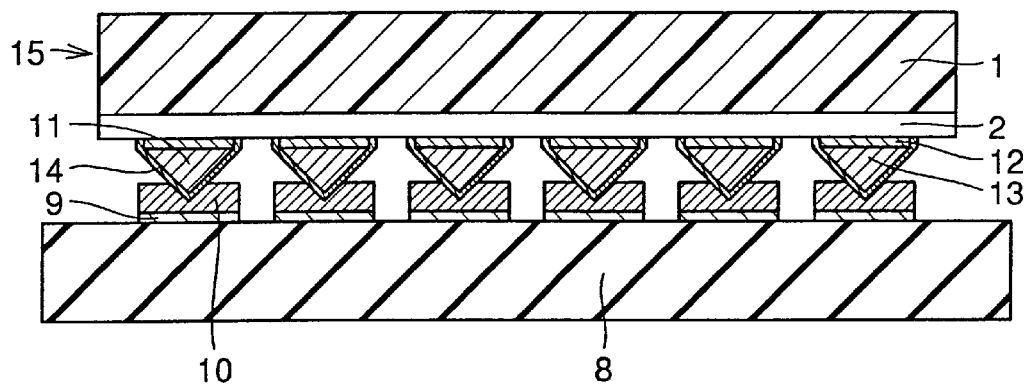
FIG. 3 is a cross sectional view showing the LGA type semiconductor device according to the first embodiment mounted on a mounting substrate.

FIG. 3 is a cross sectional view showing the LGA type semiconductor device of the first embodiment being mounted on the mounting substrate. Note that the same portions as the prior art example are denoted by the same reference numerals, and therefore the description thereof will not be repeated.

In mounting semiconductor device 15 onto mounting substrate 8, bonding medium 10 is preliminarily printed and applied onto substrate external electrode 9 of mounting substrate 8. In this state, semiconductor device 15 is mounted onto mounting substrate 8. At the time, external electrode pad 13 covered with antirust medium 10 is inserted to bonding medium 10 formed on substrate external electrode 9 for bonding. Further, mounting substrate 8 mounted with semiconductor device 15 is made to reflow at a temperature of at least the melting point of bonding medium 10. Thus, bonding medium 10 melts to electrically and physically bond semiconductor device 15 and mounting substrate 8.

According to the embodiment of the present invention, if external electrode pad 13 of semiconductor device 15 is formed in a cone or pyramid shape, greater adhesion of external electrode pad 13 and bonding medium 10 is obtained in mounting semiconductor device 15 onto mounting substrate 8. Thus, positioning accuracy of external electrode 11 of semiconductor device 15 and substrate external electrode 9 of mounting substrate 8 is enhanced. Further, bonding reliability of mounting substrate 8 and semiconductor device 15 is effectively enhanced.

Second Embodiment

Figure 4:
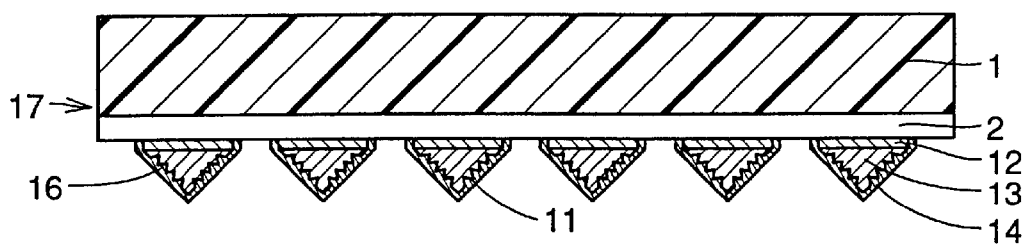
FIG. 4 is a cross sectional view showing an LGA type semiconductor device according to a second embodiment.

FIG. 4 is a cross sectional view showing an LGA type semiconductor device of the second embodiment. Note that the same portions as the device of the first embodiment are denoted by the same reference numerals in FIG. 4, and the description thereof will not be repeated.

Referring to FIG. 4, a groove 16 is formed in the surface of external electrode pad 13. Groove 16 is in a cone or pyramid shape, internally extending. An antirust medium 14 is provided on the surface of external electrode pad 13. Note that the position and number of grooves 16 are not particularly limited.

Now, the operation will be described.

Figure 5:
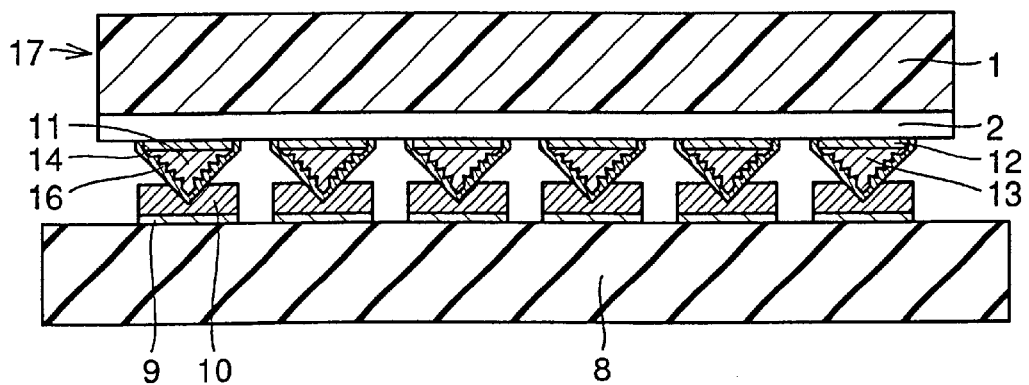
FIG. 5 is a cross sectional view showing the LGA type semiconductor device according to the second embodiment mounted on a mounting substrate.

FIG. 5 is a cross sectional view showing an LGA type semiconductor device of the second embodiment being mounted on a mounting substrate. Note that the same portions as the device of the first embodiment are denoted by the same reference numerals, and the description thereof will not be repeated.

In mounting semiconductor device 17 onto mounting substrate 8, a bonding medium 10 is preliminarily printed and applied onto substrate external electrode 9 of mounting substrate 8. In this state, semiconductor device 17 is mounted on mounting substrate 8. At the time, external electrode pad 13 covered with antirust medium 14 and provided in its surface groove 16 is inserted to bonding medium 10 on substrate external electrode 9 for bonding. Further, mounting substrate 8 mounted with semiconductor device 17 is made to reflow at a temperature of at least the melting point of bonding medium 10. Thus, bonding medium 10 melts to electrically and physically bond semiconductor device 17 and mounting substrate 8.

According to the embodiment of the present invention, groove 16 in a cone or pyramid shape formed in the surface of external electrode pad 13 provides greater adhesion of external electrode pad 13 and bonding medium 10 in mounting semiconductor device 17 onto mounting substrate 8. Thus, positioning accuracy of external electrode 11 of semiconductor device 17 and substrate external electrode 9 of mounting substrate 8 is enhanced. Further, bonding reliability of mounting substrate 8 and mounted semiconductor device 17 is enhanced.

Third Embodiment

Figure 6:
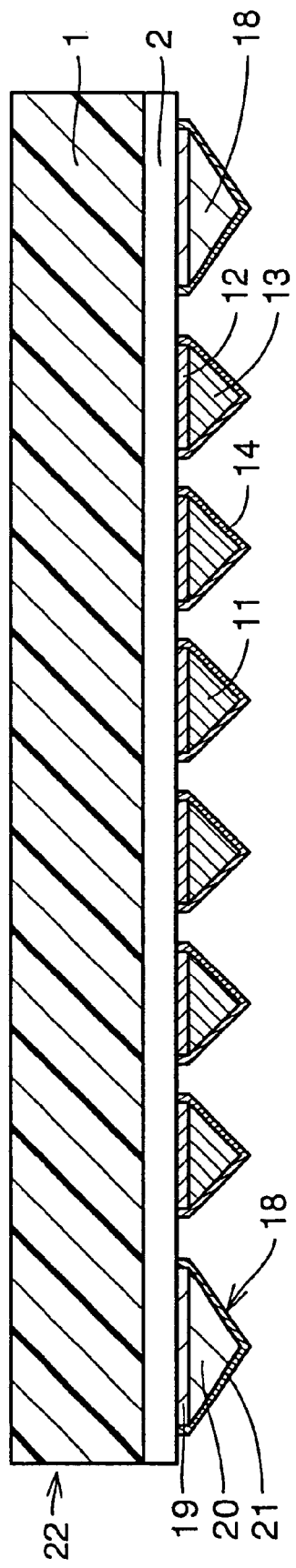
FIG. 6 is a cross sectional view showing an LGA type semiconductor device according to a third embodiment.
Figure 7:
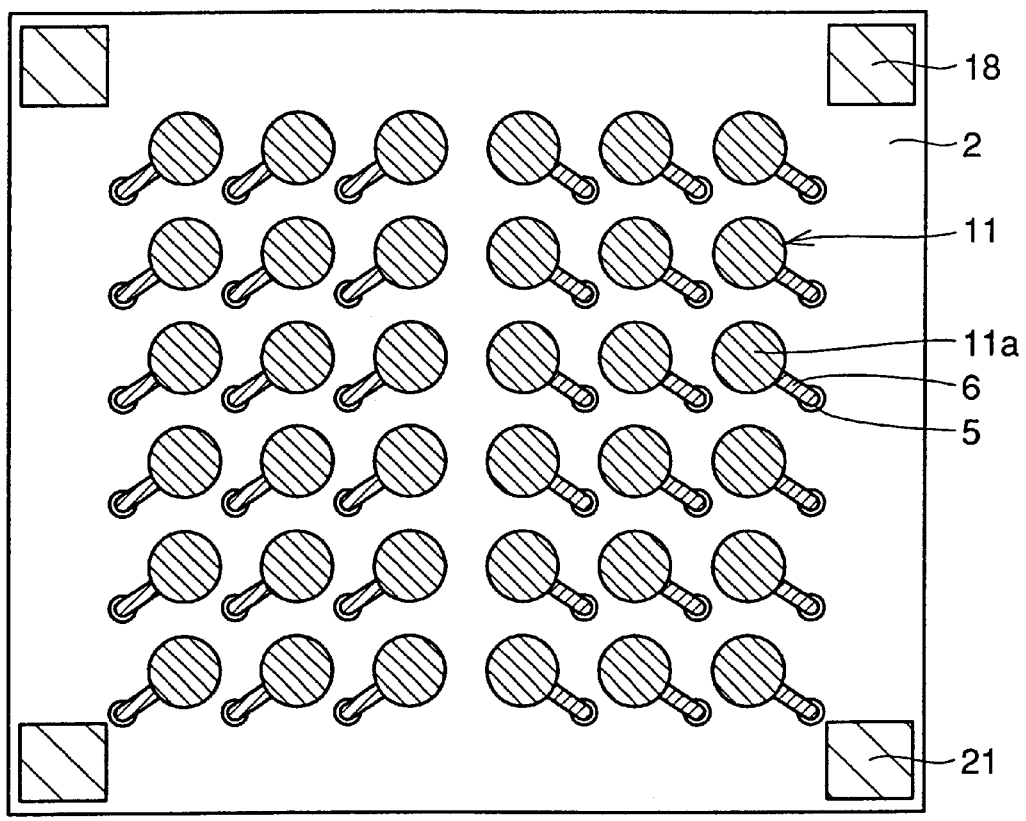
FIG. 7 is a bottom view of the LGA type semiconductor device according to the third embodiment.

FIG. 6 is a cross sectional view showing an LGA type semiconductor device of the third embodiment, and FIG. 7 is a bottom view thereof when viewed from above. In the drawings, the same portions as the device of the above described embodiment are denoted by the same reference numerals, and the description thereof will not be repeated.

Referring to FIGS. 6 and 7, a semiconductor device 22 is provided with a substrate 2. A dummy electrode 18 is provided on the surface of substrate 2 on the side opposite sealing portion 1. Dummy electrode 18 has a shape different from that of external electrode 11 and is not electrically nor physically connected to external electrode 11.

Dummy electrode 18 includes a first external electrode pad 19 and a second external electrode pad 20 formed to overlap with each other. Although first external electrode pad 19 is in a cylindrical shape in the present embodiment, it may be in a rectangular column shape. First external electrode pad 19 has a thickness of 12–32 μm. First external electrode pad 19 is formed of a copper foil or a copper foil with a copper solder. Second external electrode pad 20 is formed to cover the entire surface of first external electrode pad 19. Although second external electrode pad 20 is in a cone shape in the present embodiment, it may be in a pyramid shape. Second external electrode pad 20 has a height of 12–62 μm. Second external electrode pad 20 is formed of layered copper solders. An antirust medium 21 is formed on second external electrode pad 20. Antirust medium 21 is provided to prevent oxidation of the surface of external electrode pad 20 and to promote bonding of a bonding medium in mounting the substrate. Antirust medium 21 is formed of a flux with a gold solder or nickel gold solders. Although dummy electrode 18 is arranged on the side of substrate 2 that is opposite sealing portion 1, the arrangement method and number are not particularly limited. In the present embodiment, the side number of the rectangular column and pyramid are not particularly limited.

Now, the operation will be described.

Figure 8:
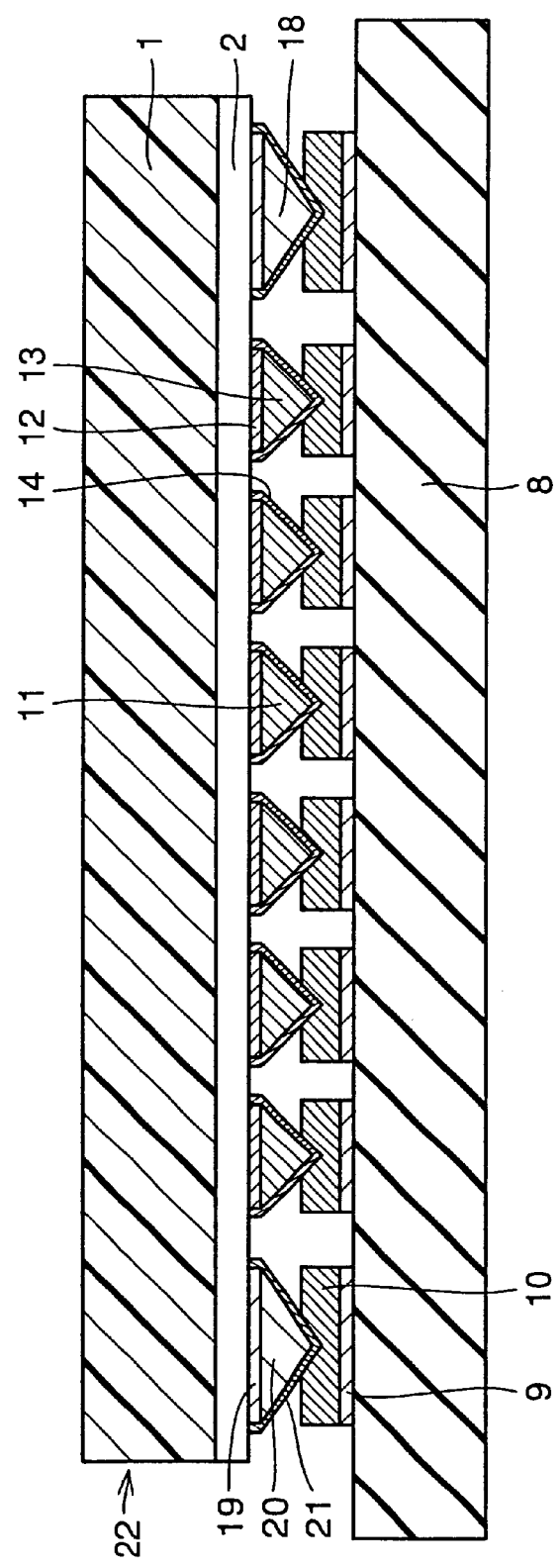
FIG. 8 is a cross sectional view showing the LGA type semiconductor device according to the third embodiment mounted on a mounting substrate.
Figure 9:
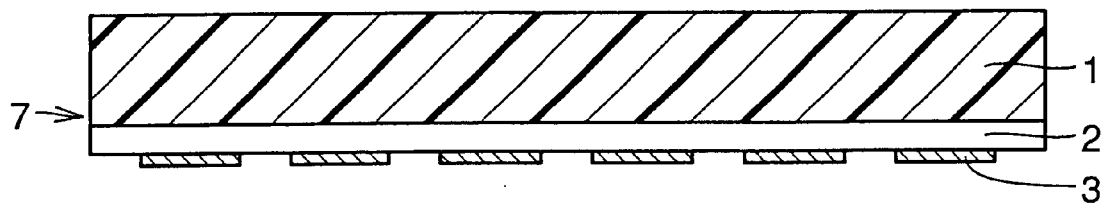
FIG. 9 is a cross sectional view showing the conventional LGA type semiconductor device.
Figure 10:
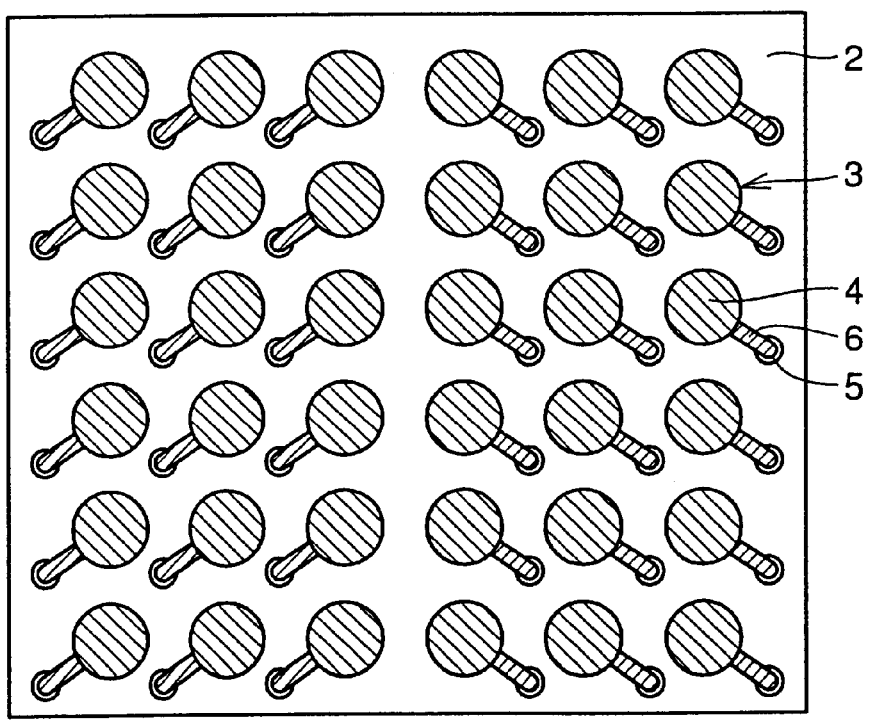
FIG. 10 is a bottom view of the conventional LGA type semiconductor device.
Figure 11:
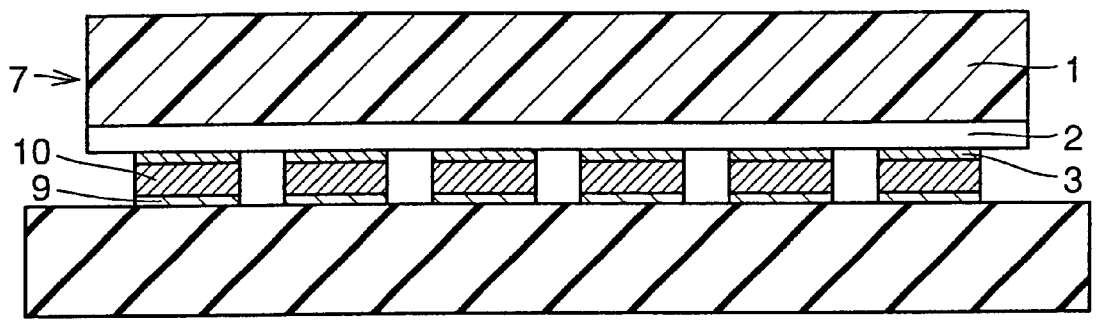
FIG. 11 is a cross sectional view showing the conventional LGA type semiconductor device mounted on the mounting substrate.

FIG. 8 is a cross sectional view showing an LGA type semiconductor device of the third embodiment mounted on a mounting substrate. In FIG. 8, the same portions as the above described embodiment are denoted by the same reference numerals, and the description thereof will not be repeated.

Referring to FIG. 8, in mounting semiconductor device 22 onto mounting substrate 8, a bonding medium 10 is preliminarily printed and applied onto a substrate external electrode 9 of mounting substrate 8. In this state, semiconductor device 22 is mounted on mounting substrate 8. At the time, an external electrode pad 13 (on the side of external electrode 11) covered with antirust medium 14 and an external electrode pad 20 (on the side of dummy electrode 18) covered with an antirust medium 21 are inserted to bonding medium 10 on substrate external electrode 9 for bonding. Further, mounting substrate 8 mounted with semiconductor device 22 is made to reflow at a temperature of at least the melting point of bonding medium 10. Thus, bonding medium 10 melts to electrically and physically connect semiconductor device 22 and mounting substrate 8.

According to the embodiment of the present invention, in addition to external electrode pad 13 of external electrode 11, external electrode pad 20 is formed on the side of dummy electrode 18. Thus, external electrode pad 20 of dummy electrode 18 promotes bonding of external electrode 11 and bonding medium 10 in mounting semiconductor device 22 on mounting substrate 8. As a result, adhesion of external electrode 11 and bonding medium 10 is enhanced, whereby positioning accuracy of external electrode 11 of semiconductor device 22 and substrate external electrode 9 of mounting substrate 8 increases. Further, bonding reliability of mounting substrate 8 and mounted semiconductor device 22 increases.

Note that if the above described groove 16 is formed in one of, or both surfaces of external electrode pad 13 of external electrode 11 and external electrode pad 20 of dummy electrode 18, a more favorable effect can be obtained.

As in the foregoing, the LGA type semiconductor device according to the first aspect of the present invention provides enhanced positioning accuracy of the external electrode of the semiconductor device and the substrate external electrode of the mounting substrate. Further, bonding reliability of the mounting substrate and the mounted semiconductor device is enhanced.

Further, the method of mounting the LGA type semiconductor device according to the second aspect of the present invention provides enhanced positioning accuracy of the external electrode of the semiconductor device and the substrate external electrode of the mounting substrate. In addition, bonding reliability of the mounting substrate and the mounted semiconductor device is enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An land grid array semiconductor device comprising:

a substrate; and a plurality of external electrodes arranged in an array on a surface of said substrate, each of said external electrodes including an external electrode pad and an external electrode interconnection extending through said substrate via a through hole, wherein each of said external electrode pads includes a first pad layer having a cylindrical or rectangular columnar shape, a second pad layer on said first pad layer and having a conical or pyramidal shape, and an anti-oxidation layer covering at least said second pad layer for preventing oxidation of said second pad layer.

2. A land grid array semiconductor device comprising: a substrate; and external electrodes arranged in an array on a surface of said substrate, each of said external electrodes including an external electrode pad and an external electrode interconnection extending through said substrate via a through hole, wherein each of said external electrode pads includes a first pad layer having a cylindrical or rectangular columnar shape and a second pad layer having a conical or pyramidal shape and disposed on said first pad layer, wherein said second pad layer has a recess in a surface.

3. The land grid array semiconductor device according to claim 2, wherein the recess is a groove having a conical or pyramidal shape.

4. The land grid array semiconductor device according to claim 2, including a dummy electrode on the surface of said substrate, having a shape different from said external electrode pad, and not electrically nor physically connected to said external electrode pad.

5. The land grid array semiconductor device according to claim 4, wherein said dummy electrode includes a first layer in a cylindrical or rectangular columnar shape, and a second layer in a conical or pyramidal shape, covering a surface of said first layer.

6. The land grid array semiconductor device according to claim 1, wherein said first pad layer comprises copper.

7. The land grid array semiconductor device according to claim 1, wherein said anti-oxidation layer covers said first pad layer and said second pad layer.

8. The land grid array semiconductor device according to claim 7, wherein said anti-oxidation layer comprises at least one of nickel and gold.

9. The land grid array semiconductor device according to claim 1, wherein said anti-oxidation layer comprises at least one of nickel and gold.

10. The land grid array semiconductor device according to claim 1, wherein said second pad layer includes at least on recess in a surface and filled by said anti-oxidation layer.

11. The land grid array semiconductor device according to claim 10, wherein the recess has a conical or pyramidal shape.

12. The land grid array semiconductor device according to claim 1 including a dummy electrode on the surface of said substrate, having a shape different from said external electrode pad, and not electrically nor physically connected to said external electrode pad.

13. The land grid array semiconductor device according to claim 12, wherein said dummy electrode includes a first layer having a cylindrical or rectangular columnar shape, a second layer having a conical or pyramidal shape on said first layer, and an anti-oxidation layer covering at least said second layer.

* * * * *